(12) United States Patent
Apostolos et al.

(10) Patent No.: US 10,539,856 B2
(45) Date of Patent: Jan. 21, 2020

(54) SCANNING DEVICE

(71) Applicant: AMI Research & Development, LLC, Windham, NH (US)

(72) Inventors: John T. Apostolos, Lyndeborough, NH (US); William Mouyos, Windham, NH (US)

(73) Assignee: AMI Research & Development, LLC, Merrimack, NH (US)

( * ) Notice: Subject to any disclaimer, the term of this patent is extended or adjusted under 35 U.S.C. 154(b) by 171 days.

(21) Appl. No.: 15/615,103

(22) Filed: Jun. 6, 2017

(65) Prior Publication Data
US 2018/0052379 A1 Feb. 22, 2018

Related U.S. Application Data

(60) Provisional application No. 62/346,757, filed on Jun. 7, 2016, provisional application No. 62/346,779, filed on Jun. 7, 2016, provisional application No. 62/454,393, filed on Feb. 3, 2017.

(51) Int. Cl.
*G02F 1/295* (2006.01)
*G01S 7/481* (2006.01)
*H04N 5/232* (2006.01)

(52) U.S. Cl.
CPC ............ *G02F 1/295* (2013.01); *G01S 7/4816* (2013.01); *G01S 7/4817* (2013.01); *H04N 5/23245* (2013.01); *G02F 2201/20* (2013.01)

(58) Field of Classification Search
CPC . G02F 1/295; G02F 2201/20; H04N 5/23245; G01S 7/4817; G01S 7/4816
See application file for complete search history.

(56) References Cited

U.S. PATENT DOCUMENTS

| 8,582,935 | B2 | 11/2013 | Apostolos et al. | |
|---|---|---|---|---|
| 8,710,360 | B2 | 4/2014 | Apostolos et al. | |
| 8,988,303 | B1 | 3/2015 | Apostolos et al. | |
| 9,013,360 | B1 | 4/2015 | Apostolos et al. | |
| 9,246,230 | B2 | 1/2016 | Apostolos et al. | |
| 9,509,056 | B2 | 11/2016 | Apostolos et al. | |
| 2004/0046870 | A1* | 3/2004 | Leigh Travis | G02B 5/045 348/207.99 |
| 2010/0126584 | A1* | 5/2010 | Seol | G02B 6/12007 136/259 |
| 2012/0206807 | A1* | 8/2012 | Apostolos | H01L 31/02325 359/493.01 |
| 2014/0167195 | A1* | 6/2014 | Bodan | H01L 27/144 257/432 |
| 2014/0232692 | A1* | 8/2014 | Powell | G06F 3/0428 345/175 |
| 2015/0318621 | A1 | 11/2015 | Apostolos et al. | |

OTHER PUBLICATIONS

Shackelford, Robert G., "Fresnel Zone Radiation Patterns of Microwave Antennas", Georgia Institute of Technology, M.S. Thesis, Jun. 1962, 69 pages.
U.S. Appl. No. 15/362,988, filed Nov. 29, 2016 by AMI Research and Development, LLC for Super Directive Array of Volumetric Antenna Elements for Wireless Device Applications, 58 pages.

* cited by examiner

*Primary Examiner* — Jason A Flohre
(74) *Attorney, Agent, or Firm* — David J. Thibodeau, Jr.; VLP Law Group LLP

(57) ABSTRACT

A scanning optical device suitable for use as a camera or solar concentrator.

10 Claims, 16 Drawing Sheets

$\cos\theta = \dfrac{\beta_{WAVEGUIDE}}{\beta_{(WEDGE)}}$   SHOWING A 1° θ ERROR

RAYLEIGH
(EARTHQUAKE)
WAVE

SCANNING DEVICE

CROSS REFERENCE TO RELATED APPLICATIONS

This application claims priority to U.S. Provisional Patent Application Ser. No. 62/346,757 filed Jun. 7, 2016 entitled "Flat Optical Camera", Ser. No. 62/346,779 filed Jun. 7, 2016 entitled "Flat Coherent Solar Concentrator", and Ser. No. 62/454,393 filed Feb. 3, 2017 entitled "Dielectric Travelling Waveguide with Varactors to Control Beam Direction", the entire contents of each of which are hereby incorporated by reference.

BACKGROUND

Recent developments in the use of dielectric waveguides provide functions normally associated with antenna arrays. The waveguides are generally configured as an elongated slab with a top surface, a bottom surface, a feed end, and a load end. The slab may be formed from two or more dielectric material layers such as silicon nitride, silicon dioxide, magnesium fluoride, titanium dioxide or other materials suitable for propagation at a desired frequency or wavelength of operation.

In one implementation, physical gaps are formed between the layers. A control element is also provided to adjust a size of the gaps. The control element may, for example, be a piezoelectric or electroactive material or a mechanical position control. Changing the size of the adjustable gaps has the effect of changing the effective propagation constant of the waveguide. This in turn allows for scanning the resulting beam at different angles. These devices have been designed for use at radio frequencies, acting as a directional radio antenna, and at visible wavelengths, acting as a solar energy concentrator.

See U.S. Pat. Nos. 8,582,935, 8,710,360 and 9,246,230, incorporated by reference herein, for some example implementations.

As explained in those patents, a coupling layer may also be used that has a dielectric constant that changes as a function of distance from the excitation end to the load end. By providing increased coupling between the waveguide and the correction layer in this way, horizontal and vertical mode propagation velocities may be controlled.

Adjacent dielectric layers may be formed of materials with different propagation constants. In those implementations, layers of low dielectric constant material may be alternated with layers of high dielectric constant material. These configurations can provide frequency-independent control over beam shape and beam angle.

The waveguide may also act as a feed for a line array of antenna elements. In some implementations, a pair of waveguides are used. Coupling between the variable dielectric waveguide(s) and the antenna elements can also be individually controlled to provide accurate phasing of each antenna element. See for example U.S. Pat. No. 9,509,056 incorporated by reference herein.

The elements of an antenna array may also be fed in series by a structure formed from a transmission line disposed adjacent a waveguide with reconfigurable gaps between layers. The transmission line may be a low-dispersing microstrip, stripline, slotline, coplanar waveguide, or any other quasi-TEM or TEM transmission line structure. The gaps introduced in between the dielectric layers provide certain properties, such as a variable propagation constant to control the scanning of the array.

Alternatively, a piezoelectric or ElectroActive Polymer (EAP) actuator material may provide or control the gaps between layers, allowing these layers to expand, or causing a gel, air, gas, or other material to compress. See U.S. patent application Ser. No. 14/702,147 filed May 1, 2015 incorporated by reference herein for more details.

SUMMARY

The apparatus described herein is a type of dielectric travelling waveguide device that can be used to steer optical radiation in two dimensions. The optical device may be used as a camera or as a solar concentrator. In a preferred implementation, the device includes a first or main waveguide that is a generally elongated rectangle with a top surface and exit face. A progressive delay layer is placed on the top surface. A second or auxiliary progressive delay layer and waveguide are disposed adjacent an exit face of the main waveguide. The delay introduced by layers is preferably a continuous, linear propagation delay. It may be implemented as a layer of material with a particular shape or construction as will be described below.

For a camera implementation, optical detectors, such as one photodiode each for the red, green, and blue wavelengths, or a broadband device such as a charge coupled device (CCD), are disposed adjacent an exit face of the auxiliary waveguide.

For a solar concentrator implementation, the detector(s) may include one or more Metal-Insulator-Metal (MIM) rectifiers. As with the camera implementation, the solar detector(s) may be broadband, or may be provided by multiple narrower band detectors.

By controlling the index of refraction ($\varepsilon$) of the waveguides and/or progressive delay layers one can in turn scan the device by controlling an angle of incidence of energy arriving on the top face and hence on the detector(s).

The index of refraction can be controlled by adjusting the size of a gap between the waveguide and delay layers. In a solid state implementation, the index of refraction may be controlled with a series of varactors that control the impedance of a propagation path disposed between two or more waveguide layers.

The apparatus may be implemented with multiple substrate layers of the same or different thicknesses. The different thickness layers may be further arranged with a chirp or Bragg spacing to provide frequency independent operation.

BRIEF DESCRIPTION OF THE DRAWINGS

The following description of preferred embodiments should be read together with the accompanying drawings, of which.

DETAILED DESCRIPTION

Scanning Device

Described herein are waveguide structures adapted for scanning in the visible range to provide a flat optical camera, or at solar wavelengths, to provide a flat solar concentrator. Particular implementations use an auxiliary progressive delay with waveguide structure configuration to feed a main progressive delay with waveguide structure to scan in two dimensions (2D).

Figure 1:
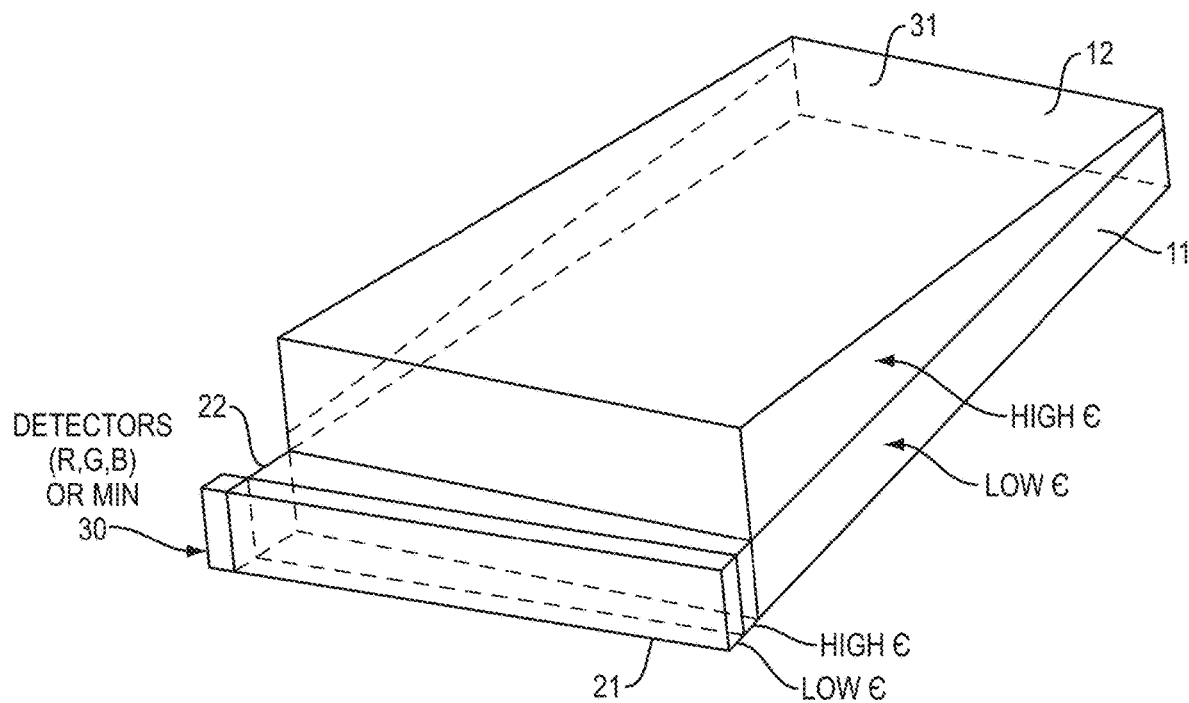
FIG. 1 is an isometric view of one implementation of the device.

FIG. 1 is a perspective view of one such implementation where a camera is provided by a main rectangular waveguide structure 11. It should be understood that an analogous structure can be used to provide a solar concentrator. The waveguide 11 is a generally elongated rectangle with a top surface and exit face. Typical dielectric materials for the waveguide may include silicon nitride, silicon dioxide, magnesium fluoride, titanium dioxide or other materials suitable for propagation at a desired operating wavelength.

A progressive delay layer 12 is placed on the top surface. A second or auxiliary progressive delay layer 22 and waveguide 21 are disposed adjacent the exit face of the main waveguide. The delay introduced by layers 12, 22 is preferably a continuous, linear propagation delay. It may be implemented as a layer of material with a particular shape or in other ways as will be described below. For the camera implementation, optical detectors 30, such as one photodiode each for the red, green, and blue wavelengths, or a broadband device such as a charge coupled device (CCD), are disposed adjacent an exit face of the auxiliary waveguide 22. In the case of a solar concentrator, the detector(s) 30 may include one or more MIM rectifiers. As with the camera implementation, the solar detector may be broadband, or may be provided by multiple narrower band detectors.

By controlling the index of refraction (ε) of the waveguides 11, 21 and/or progressive delay layers 12, 22 one can in turn control an angle of incidence of energy arriving on the top face and hence on the detector(s) 30.

Figure 2A:
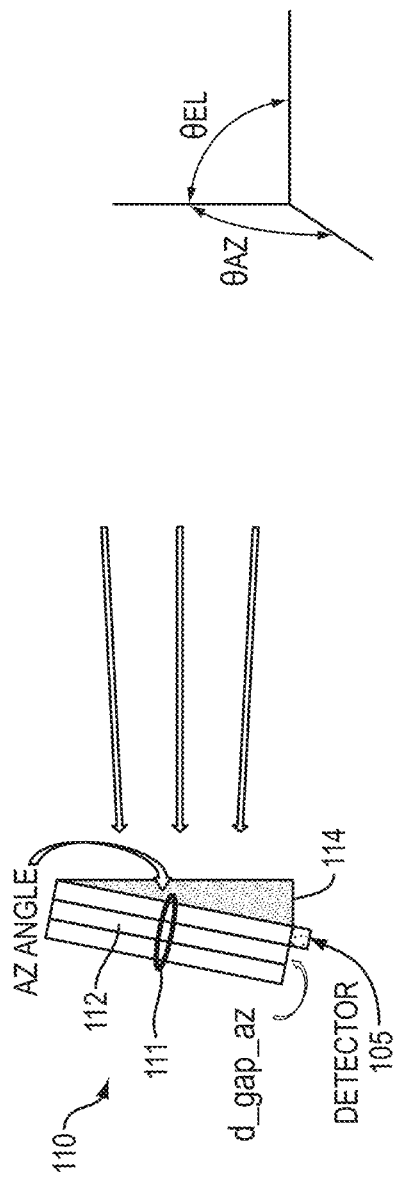
FIGS. 2A and 2B are more detailed views of the device using a wedge and gap layer.
Figure 2B:
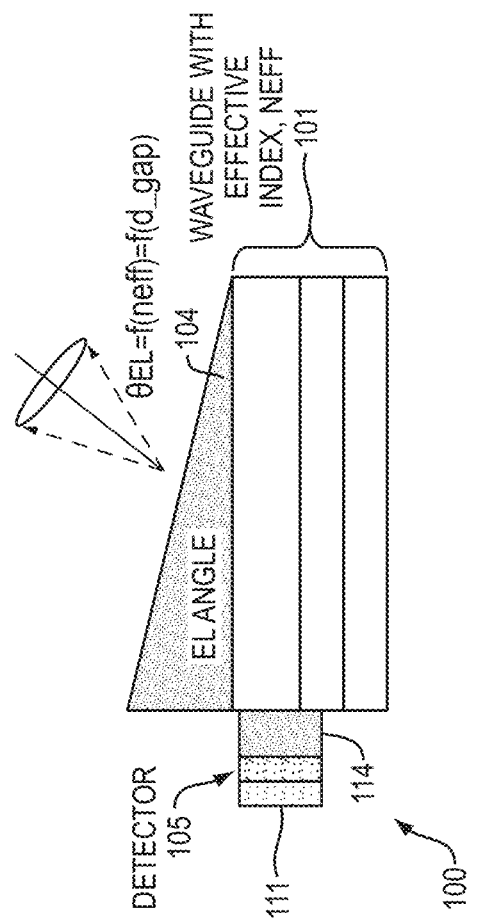

FIGS. 2A and 2B are a detailed side and top view of an implementation. As shown in FIG. 2A, a main structure 100 includes waveguide 101 with adjustable gaps 102 to provide an effective controllable index of refraction for receiving energy via the angled progressive delay layer 104. One or more suitable detectors 105 (such as photodiodes in the case of a camera implementation, or MIM diodes in the case of a solar concentrator) are placed adjacent the waveguide.

FIGS. 2A and 2B also show the auxiliary structure 110 disposed adjacent and at an angle, such as a right angle (orthogonal to), to the main structure 100. A progressive delay layer is placed between a waveguide 111 with adjustable gaps 112 and the output edge of waveguide 101 in the main structure. The auxiliary structure 110 may provide further delay, in the case of a solar concentrator implementation, so that energy received along the main structure is coherently added "in phase" at the detector 105.

The auxiliary structure 110 provides further delay so that the energy received along the main structure is coherently added "in phase" at the detector 30.

The main structure 100 provides progressive delay excitation to facilitate scanning in the elevation direction. The auxiliary structure 110 provides progressive delay excitation to effect scanning in the azimuthal direction.

The size of the gaps 102, 112 can be adjusted using piezoelectrics, electroactive or micromechanical actuators.

For implementation as a camera, the arrangement may be physically scaled and/or materials adapted to operate in a visible wavelength region from about 390 to 700 nanometers (0.39 to 0.70 microns). For implementation as a solar collector, the arrangement may be physically scaled and/or materials adapted to operate at solar wavelengths from 400 nm to 1200 nm.

The resulting device can thus scan in both elevation and azimuth without the need for multiple detectors, or mechanical scanning apparatus to provide a "flat" camera suitable for packaging in a smartphone, tablet, laptop, portable computer, or other handheld device.

However, a solar collector implementation may also be mounted on mechanical scanning and/or sun tracking apparatus. That apparatus may make of MEMS actuators to track the sun. The result in any event is a relatively "flat" concentrator of solar energy making it quite suitable for packaging. Multiple devices can be fabricated on a single semiconductor wafer; the wafers in turn can be packaged in a flat solar panel.

Camera Image Quality and Telephoto Mode

For a camera implementation, the resulting scanning phased array makes possible a camera capable of functioning in a high resolution telephoto lens configuration. Consider both objects at 1000 feet and objects closer to the camera. For example, to recognize a face at 1000 feet a phased array structure 100 of one inch in size will result in a pixel size of 0.36 inches. Coverage over a field of view (FOV) of 90 degrees may thus produce the equivalent of 40 million pixels. For a one inch diameter the far field starts at 1000 feet, while the Fresnel region begins at 1000 feet.

Figure 3:
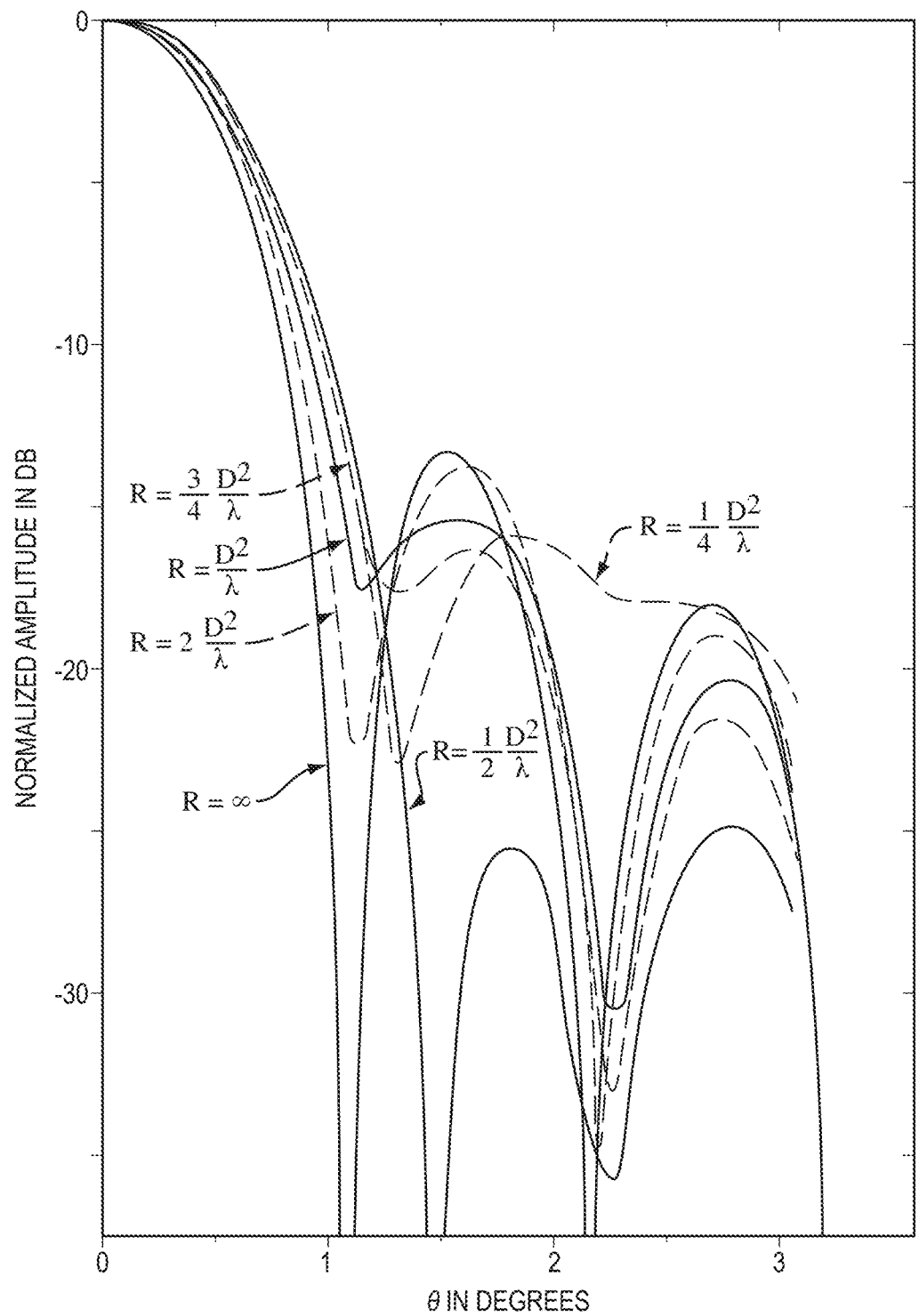
FIG. 3 is a plot of normalized amplitude versus angle.

FIG. 3 is taken from Shackelford, Robert G., "Fresnel Zone Radiation Patterns of Microwave Antennas", Georgia Institute of Technology, M.S. Thesis, 1962, shows the shape of a beam of a 5000 wavelength aperture with a reduced field of view, that is, from the start of the far field region to ⅛ of the distance to the far field. The far field beam pattern should be similar to the 1000 foot pattern for the one inch diameter optical phased array, while the ⅛ factor should be indicative of the pattern at 125 feet.

Figure 4:
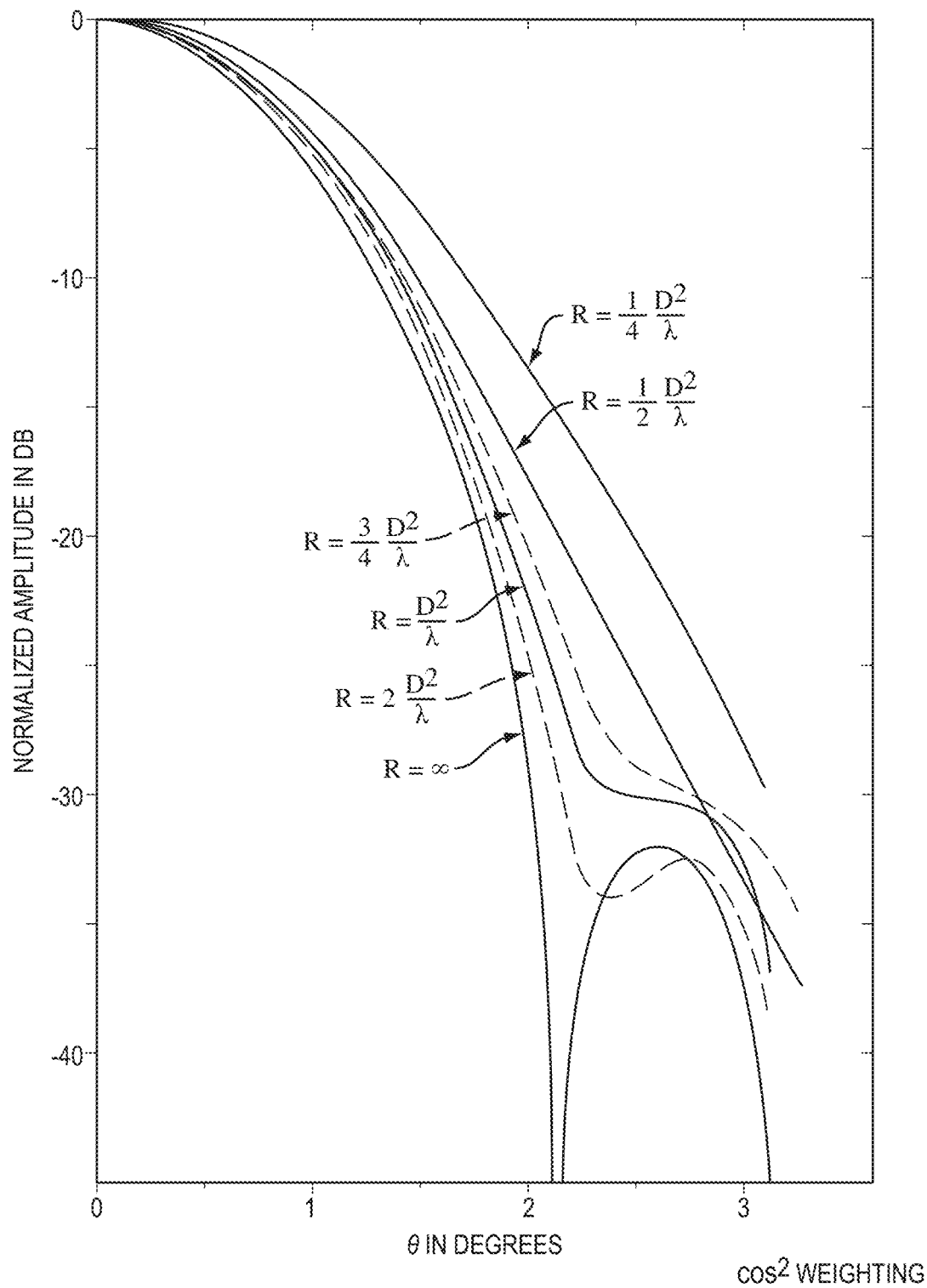
FIG. 4 is a similar plot to that of FIG. 3 showing cosine squared weighting.

FIG. 4, also from Shackelford, shows the patterns with a cosine squared weighted aperture. All the beam shapes are close to the shape for the far field case, showing that for both nearby and far field objects, good quality images will be formed.

In other words, unlike a conventional digital camera that use large arrays of individual CCD detectors, the resulting image resolution is independent of the number of detectors. Indeed, even a single, high speed detector may now be used with the scanning array. By controlling the field of view, the scanning device can be used to provide a telephoto, binocular and/or microscope operating modes without loss of resolution. Because only a single detector is required, it may be a relatively expensive detector to provide other features, such as relatively high sensitivity to low light.

Correction for Dispersion

Figure 5:
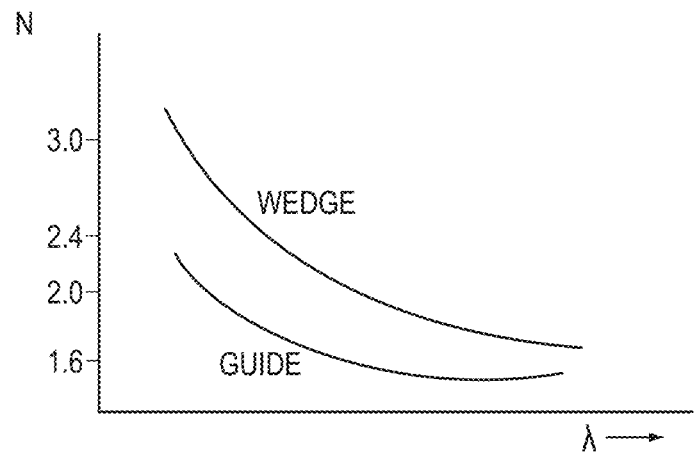
FIG. 5 is a plot of index of refraction versus delay for the wedge and waveguide.
Figure 6:
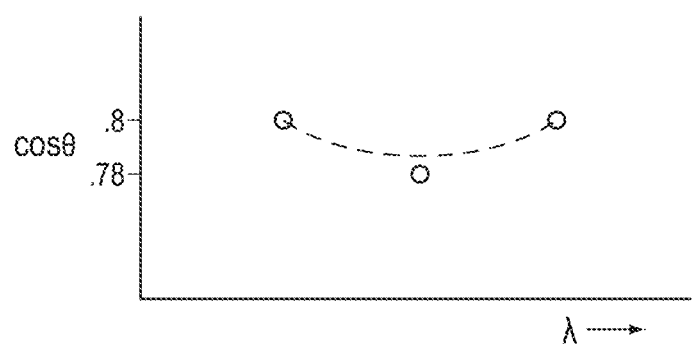
FIG. 6 is a result once these are matched.

The beam direction in a continuous waveguide with a progressive delay layer (such as for the structures described in FIGS. 2A and 2B) is affected by dispersion in the waveguide and the progressive delay layer. Rather than eliminating the dispersion for each component, it is possible to match the dispersions in the waveguide and progressive delay layer. The beam direction in this case is $$\cos(\theta) = \beta(\text{waveguide})/\beta(\text{progressive delay layer})$$

where $\beta$ is the propagation constant. Using data for the index of refraction of titanium dioxide in the optical range, example waveguide and the progressive delay layer dispersions are seen in FIG. 5. Each of the waveguide/progressive delay layer pairs of FIGS. 2A and 2B combine these dispersions resulting in a relatively constant effect on the beam direction over a range of wavelengths. See FIG. 6, showing an approximate one (1) degree error resulting in the scan angle, theta.

Scanning the Red, Green and Blue (RGB) Bands

It is possible, in some camera implementations, to include a photodiode or CCD for all of the RGB bands and thus to detect three colors simultaneously.

Figure 7A:
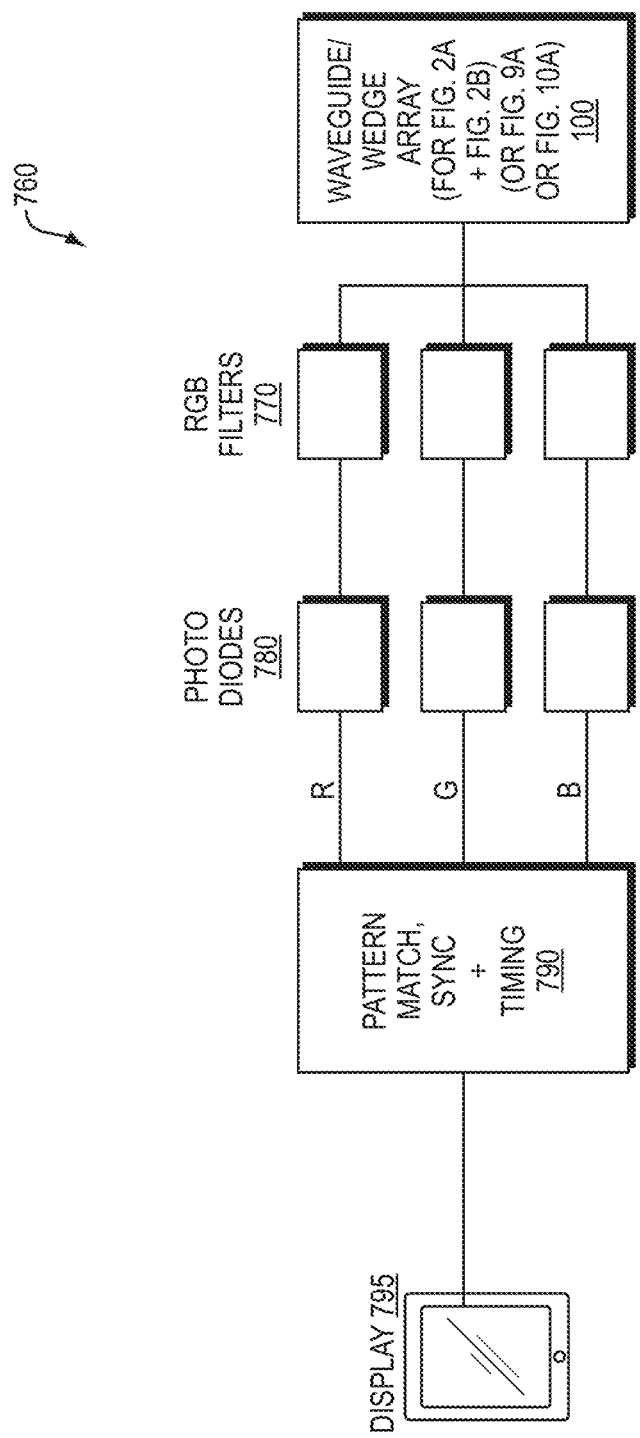
FIG. 7A is a block diagram of one implementation using the device as a color camera.

However, to compensate for dispersion and subsequent loss of angular resolution, it is also possible to scan the RGB bands separately. In the example shown in FIG. 7A, a single optical output of the array 100 of FIGS. 2A and 2B (or of FIG. 9A, 9B, 9C, or 10A) is split to feed a set of RGB filters 770 and RGB photo diodes 780. One of the image outputs (such as the G band image) is then used as a calibrated beam scan. Alignment of the RGB images is then accomplished by using a pattern recognizer 790 with the G image is used as a template. For example, a pattern recognizer may note an autocorrelation peak location of G. R and B are then cross correlated with the G image. The R and B peak locations relative to the G autocorrelation peak location may then be used to spatially align the R and B images with the G image; the RGB images are then summed to provide a composite image.

Timing circuitry (not shown), as is known, may then synchronize, sample, and digitize the resulting composite and/or separate RGB signals to provide a digital image to an output device such as a touch sensitive display 795 in a smartphone.

Another implementation is to stack the RGB diode detectors 780 in a vertical array that Red is first detector, Green is the next and Blue is the last in the stack. This allows the Green and Blue to pass through the Red and the Blue to pass through the Green.

To improve the signal to noise ratio (SNR) it is possible for the diodes 780 to dwell on the pixel of interest for a longer period of time. Another approach to improve SNR is to utilize a detector that has an inherently better SNR.

Meta Material Flat Progressive Delay Layer

Figure 8A:
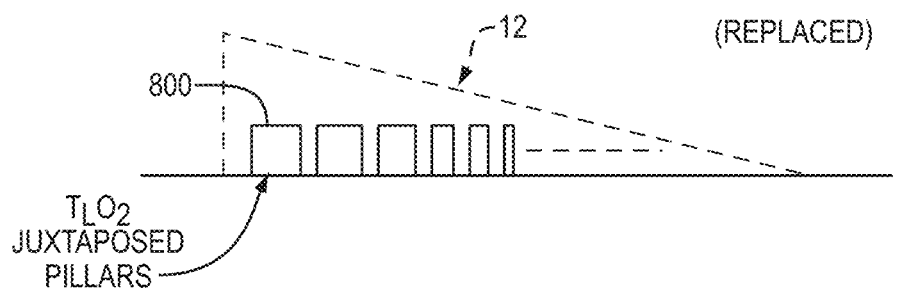
FIGS. 8A through 8C illustrate an alternate embodiment.
Figure 8B:
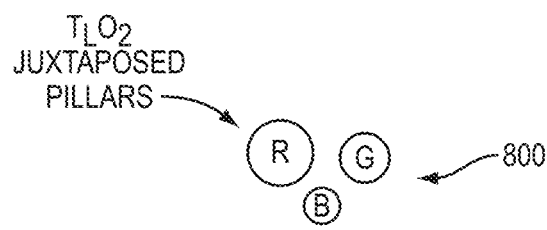
Figure 8C:
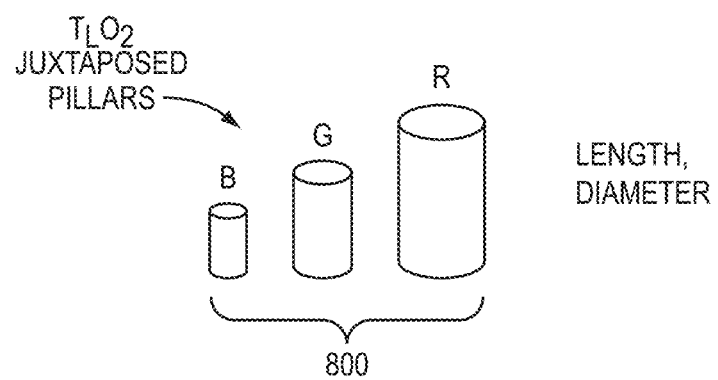

If the optical camera must be truly as flat as possible, the progressive delay layer 12, 22 may be replaced with an equivalent engineered material structure. In this implementation, as shown in FIGS. 8A, 8B and 8C, circular cross section titanium dioxide nano pillars 800 may be used as resonant structures where the delay through the pillar is related to the diameter. It may be possible to combine multiple juxtaposed resonant pillars, each resonant at the Red (R), Green (G) and Blue (B) wavelength region to achieve the required RGB bandwidth. There may be one or more pillars 800 resonant in each of the R, G, B wavelengths.

Solid State Implementations

It is also possible to use fixed, solid state structures to achieve the same effect as the adjustable gaps described above. These implementations may be preferred as they enable scanning the device without the need for an angled layer or actuators to control the gap spacing.

Figure 9A:
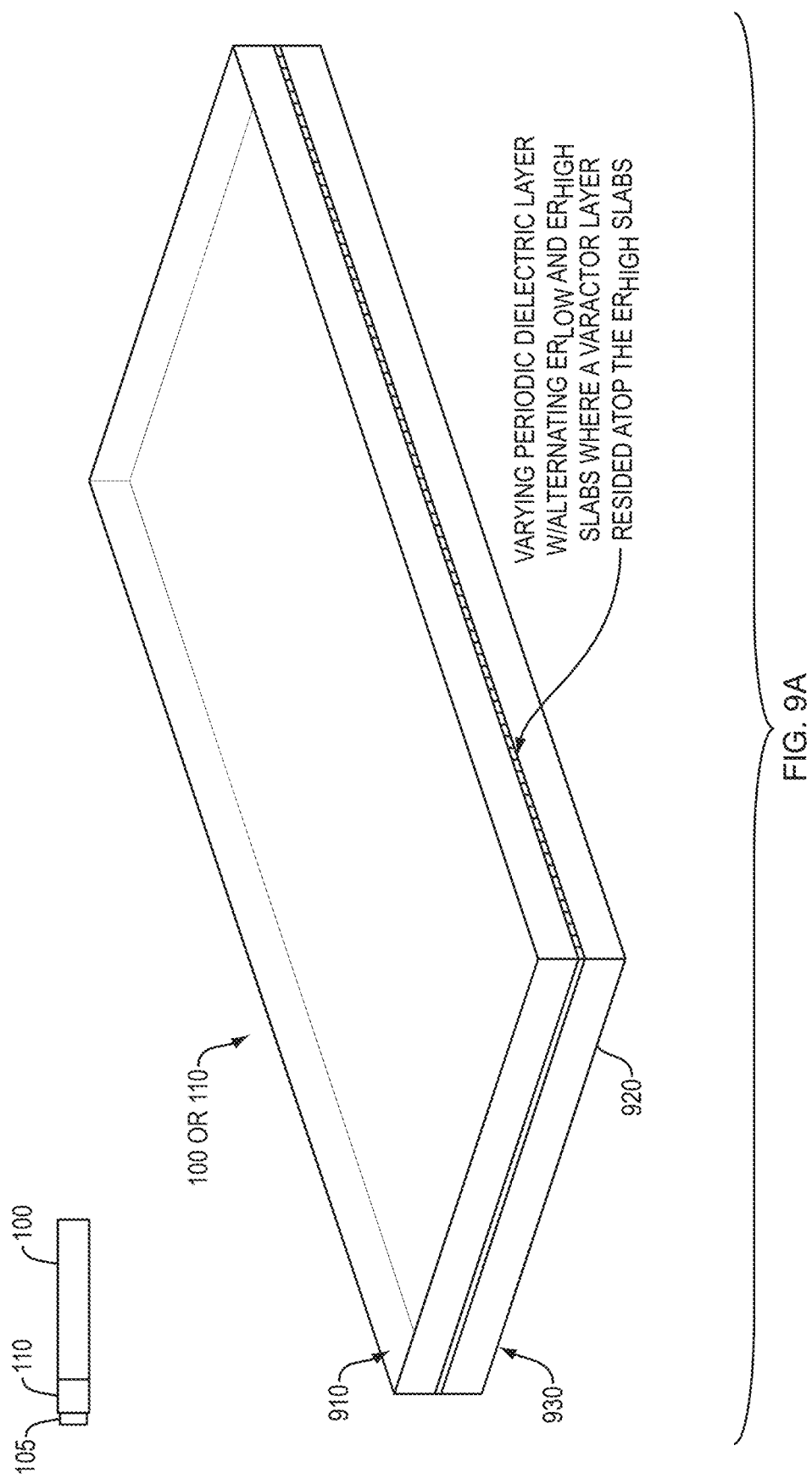
FIGS. 9A, 9B, 9C and 9D illustrate a solid-state implementation.

FIG. 9A is an isometric view of an implementation of the main waveguide 100 of the device using this approach. It should be understood that the auxiliary waveguide 110 placed adjacent the exit face of waveguide 100 may be similarly constructed, with detector(s) 105 placed adjacent the exit face of the auxiliary waveguide, as in the embodiment of FIGS. 2A and 2B.

Here, waveguide 100 (or waveguide 110) includes an upper waveguide layer 910, middle layer 920, and lower waveguide layer 930. Middle layer 920, also called the varactor layer herein, is formed of alternating sections 925, 40 of different materials having different respective dielectric propagation constants. An example first section 940 is formed of a first dielectric material having the same, or nearly the same, propagation constant as layers 910, 930. An example second section 925 is formed of a second dielectric having a different propagation constant than the first section 940.

Figure 9B:
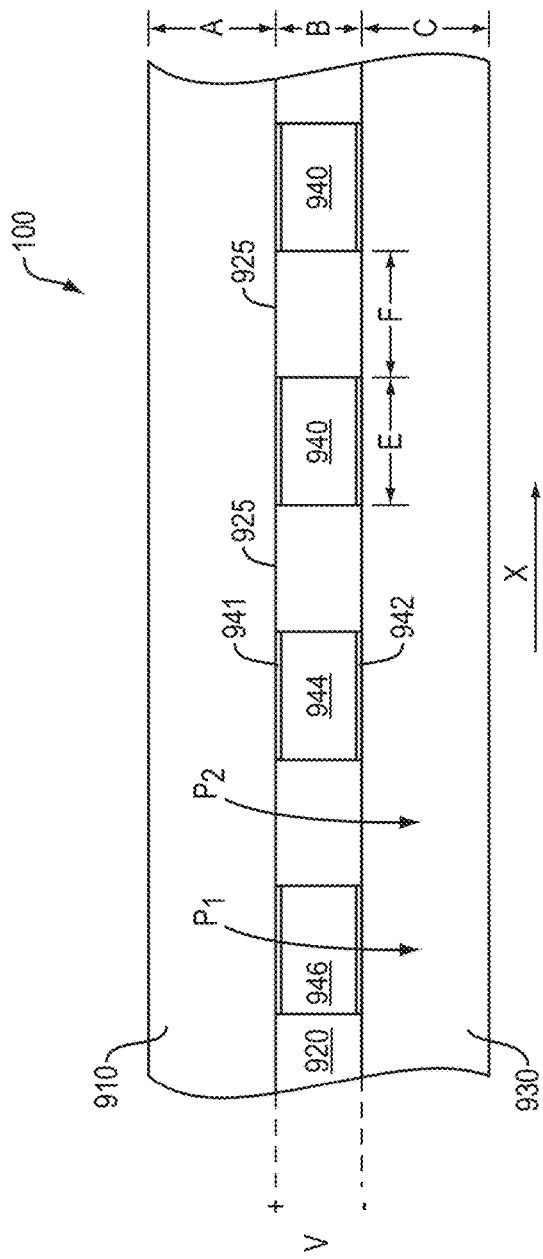
Figure 9C:
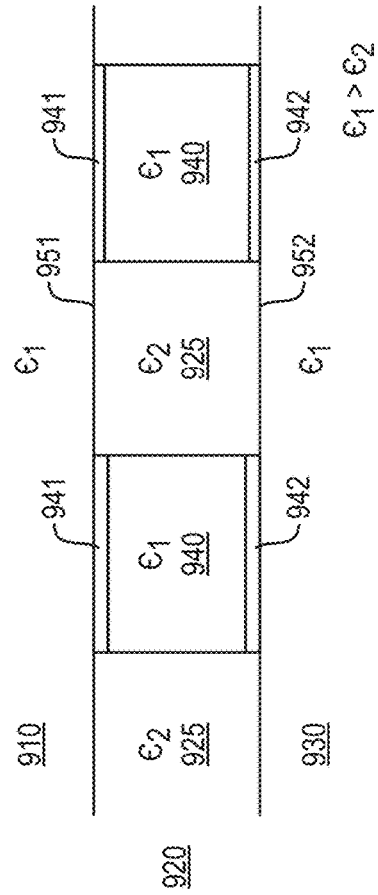

As shown in FIGS. 9B and 9C, layers 910, 130 and sections 940 may have a first propagation constant $\varepsilon_1$, and sections 125 may have a second propagation constant of $\varepsilon_2$. In one implementation, $\varepsilon_1$ is 36 and $\varepsilon_2$ is 2; that is, $\varepsilon_1$ is much greater than $\varepsilon_2$.

A material such as Indium Titanium Oxide (ITO) may be deposited on the top and bottom of sections 940 such as at 941, 942 to provide a varactor. A control circuit (not shown) imposes a controllable voltage difference, V, on 941, 942. It should also be understood that conductive traces are deposited on one or more of the layers to connected the varactors to a control circuit (also not shown).

The control voltage applied to the varactor thus changes the impedance of paths, $P_1$, from the upper waveguide 910, through the dielectric section(s) 940 to the lower waveguide 130. When that control voltage, V, is relatively high, the dielectric sections 940 become more connected to the adjacent layers 910, 930—that is, the impedance through path $P_1$ is relatively lower than the impedance through paths $P_2$. When that voltage difference is relatively smaller, the impedance through path $P_1$ becomes relatively higher.

Changing the voltage V thus changes the overall propagation constant of the waveguide 100. The voltage V can thus be used to steer the resulting beam.

In some implementations, there may be further control over the voltages applied to different ones of the sections 940 to provide a different impedance of the waveguide structure as a function of horizontal distance. That approach can provide the same properties as the wedge or taper layers in the implementation of FIGS. 2A and 2B above.

For example, if the impedance through path $P_1$ is given by $z_1$ and the impedance through path $P_1$ by $z_2$, and those impedances are progressively changed as a function of distance, x, along the waveguide, the relative propagation constant $\beta o$ can be shown to be a function of z as follows:

$$\beta_o = \sqrt{\frac{z1}{z2}}$$

with the impedance, z, of a particular varactor section 940 may depend upon a ratio of its width and height.

To provide progressive delay along the waveguide, the impedance z of a particular waveguide section may be changed as a function of its position or distance, x, along the waveguide, such that $z_1 = z_1(x)$ and $z_2 = z_2(x)$. In this way, one can effect a delay to incident energy arriving at the waveguide depending upon location along the waveguide. This provides the analogous result as the implementation of FIGS. 2A and 2B that use wedge shaped layers 104, 114.

One can also control the amount of dispersion in the waveguide 100 by controlling the spacing F between the varactor sections 940. Spacing them at a fraction of the operating wavelength ($\lambda$) of about $\lambda/10$ apart appears to be preferable, although $\lambda/4$ would provide more dispersion.

Figure 9D:
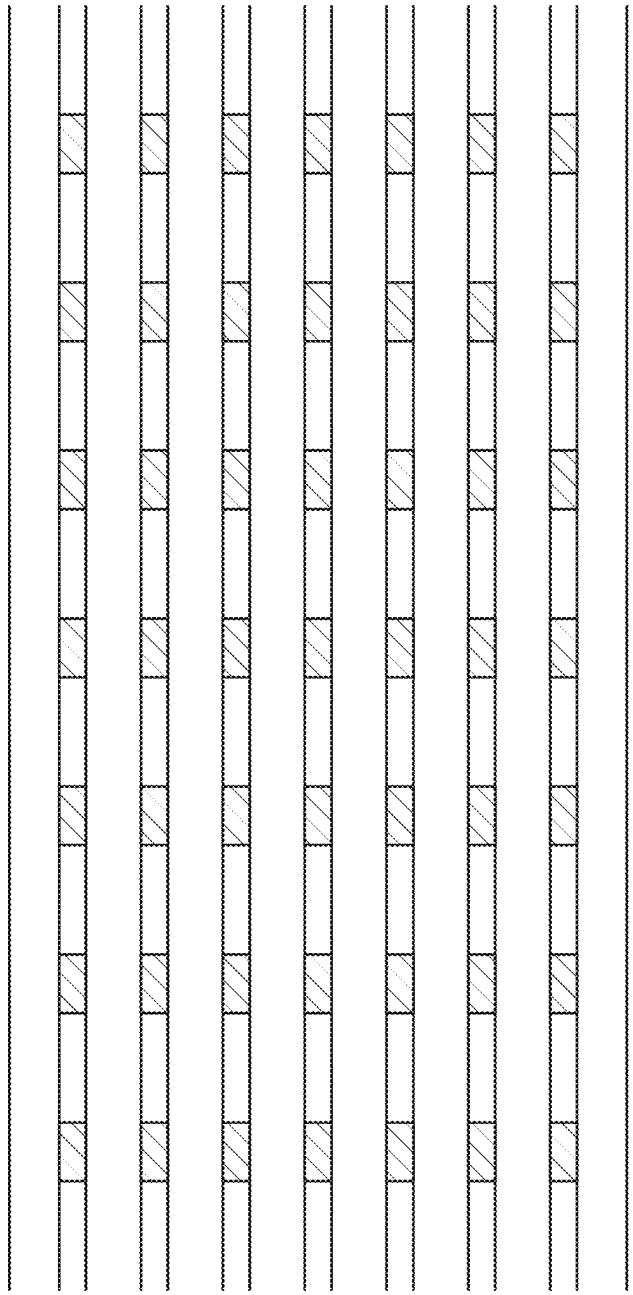

FIG. 9D illustrates an implementation with more than three layers. Here the layers 910, 920 and 930 may have progressively larger thickness, although implementations with multiple layers 910, 920 and 930 with uniform thickness is also possible. The relative increase in thickness can follow a proscribed pattern, such as a chirped or Bragg pattern, as described in the patents and patent applications referenced above.

The scanning main with scanning auxiliary waveguide 100 and 110 structure can be used with radio frequency (RF) antenna arrays of different types. For example, waveguide 100 may be used to feed one of the Orientation Independent Antennas described in U.S. Pat. Nos. 8,988,303 and 9,013,360 as well as U.S. patent application Ser. No. 15/362,988 filed Nov. 29, 2016 all of which are hereby incorporated by reference.

Figure 10A:
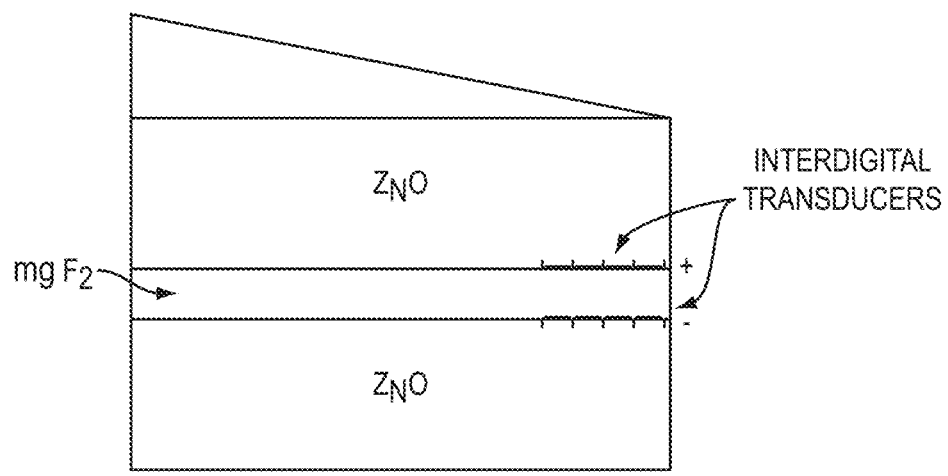
FIGS. 10A, 10B, 10C and 10D illustrate other solid-state implementations.
Figure 10B:
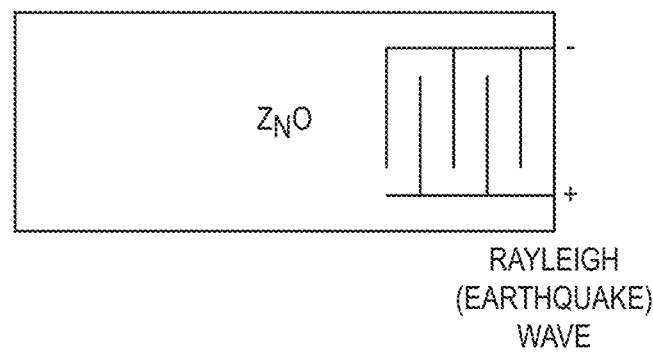
Figure 10C:
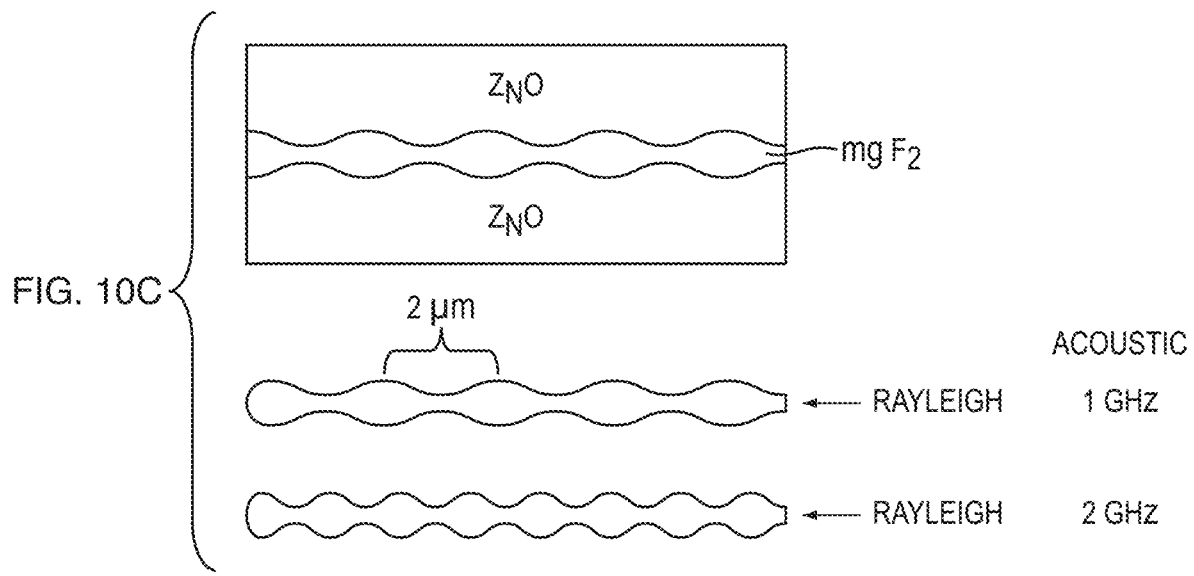

In another solid state implementation, shown in FIG. 10A (side view) and FIG. 10B (top view), the waveguide is formed of two facing layers of a material such as zinc oxide (ZnO). A magnesium fluoride ($MgF_2$) layer is formed on each facing surface such as by sputter deposition on the two facing ZnO layers. Conductive fingers are deposited on the facing surfaces to form interdigital transducers. By driving the two transducers with opposite phases (+ and – sine waves, for example at 1 GHz), a standing acoustic wave may be produced along the facing surfaces as shown. Changing the frequency of the driving signal then changes the propagation constant of the waveguide.

Figure 10D:
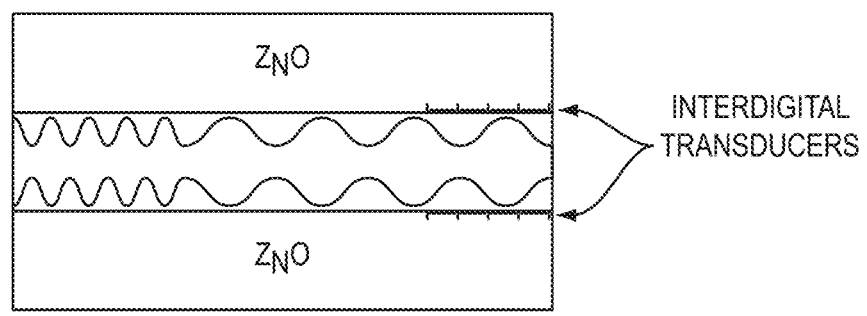

Another solid state implementation is shown in FIG. 10D. There the progressive delay continuous phase structure is similar to that of FIG. 10A, but fed with a pair of opposite phase chirp signals instead of opposing sinusoids. The specific delay in the structure of FIG. 10D should be greater as one moves from right to left (away from the location of the interdigital transducers). Preferably, one would use a fixed chirp, while the solid state structure below would be used to change the propagation constant to change the beam direction.

Distance Detection

The same array shown in FIGS. 1, 2A and 2B (or FIG. 9 or FIG. 10, etc) may be used as a lightwave based distance detector (Lidar) when operated in the "transmit" direction. In this implementation, a light source such as a laser is placed adjacent where the detectors 30 are shown in FIG. 1. With the light source activated, the array 10 then provides a steerable light beam exiting from the top face 31. Known pulse ranging techniques may then be used (for example, a light pulse can be emitted, and the time of receipt of a reflection detected) to provide a ranging function.

Figure 7B:
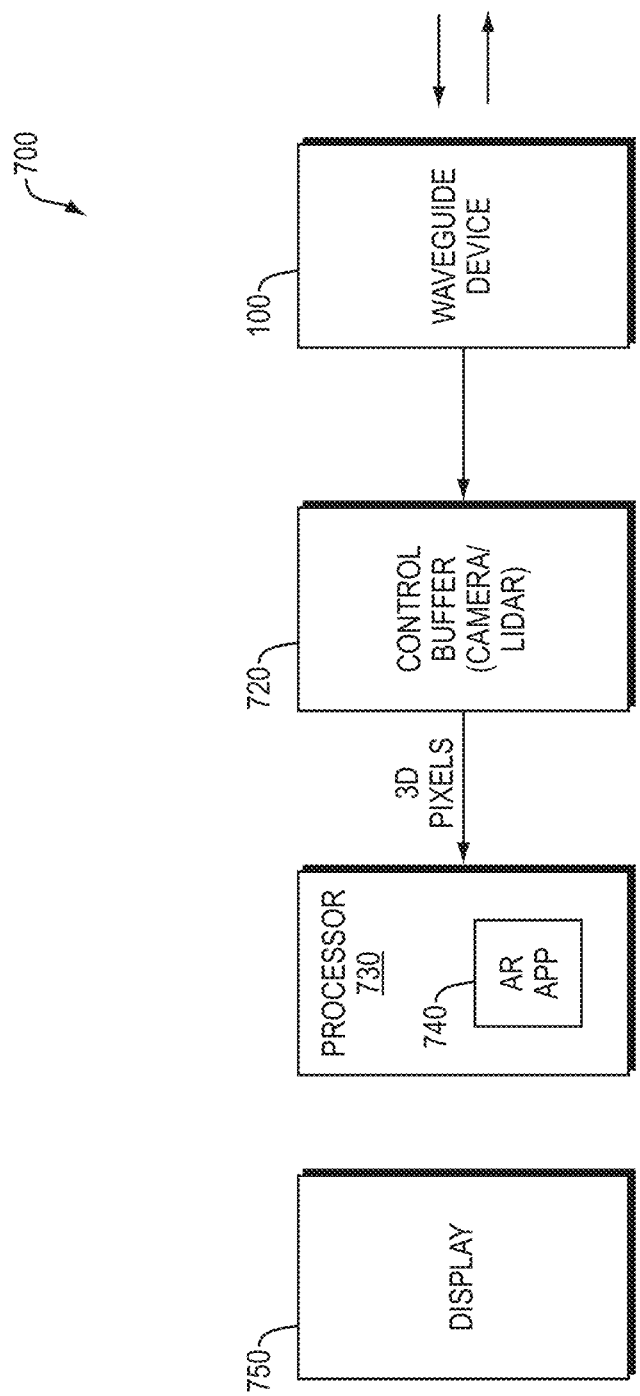
FIG. 7B is another implementation using the device to provide three dimensional pixel information including distance as well as image information.

As a result, the device can be operated in two modes, the 2D "camera mode" as described above during a first time period, and then the Lidar ranging mode during a second time period. The resulting outputs can be combined to associate a distance with each pixel and thus to produce a 3D image. This 3D image can be applied to create a virtual or augmented reality image. The device thus eliminates complicated graphical algorithmic processing that would otherwise be necessary to determine the position of objects in 3D space. As shown in FIG. 7B, the device 100 may thus be packaged in a smartphone 700 along with a control circuit 720 that alternately operates the device 100 in the camera mode (to capture image data) and the Lidar mode (to capture distance information), to output 3D pixels. The control circuit may include image and distance data buffers. The 3D pixel data may then be fed to a processor 730 that is executing an augmented reality application program 740.

In other implementations, it may be possible for the control 720 to operate one-half of the array in the 2D camera mode, and the other one-half of the array in the Lidar mode simultaneously.

Two other approaches to provide distance detection are (a) to use two flat optical cameras to provide parallax allowing for the calculation of distance or (b) using a shutter on the camera to allow half of the camera to collect a first image and then move the shutter to the other half of the camera and collect a second image.

Micro-Illumination

Since the system is reciprocal, it is illuminate the image of interest with a laser source that will provide illumination for the pixel that is being imaged. By inserting a laser source at detector location it is possible to transmit to the pixel location of interest.

Comparison of Air Gap and Solid State Implementations

Figure 11A:
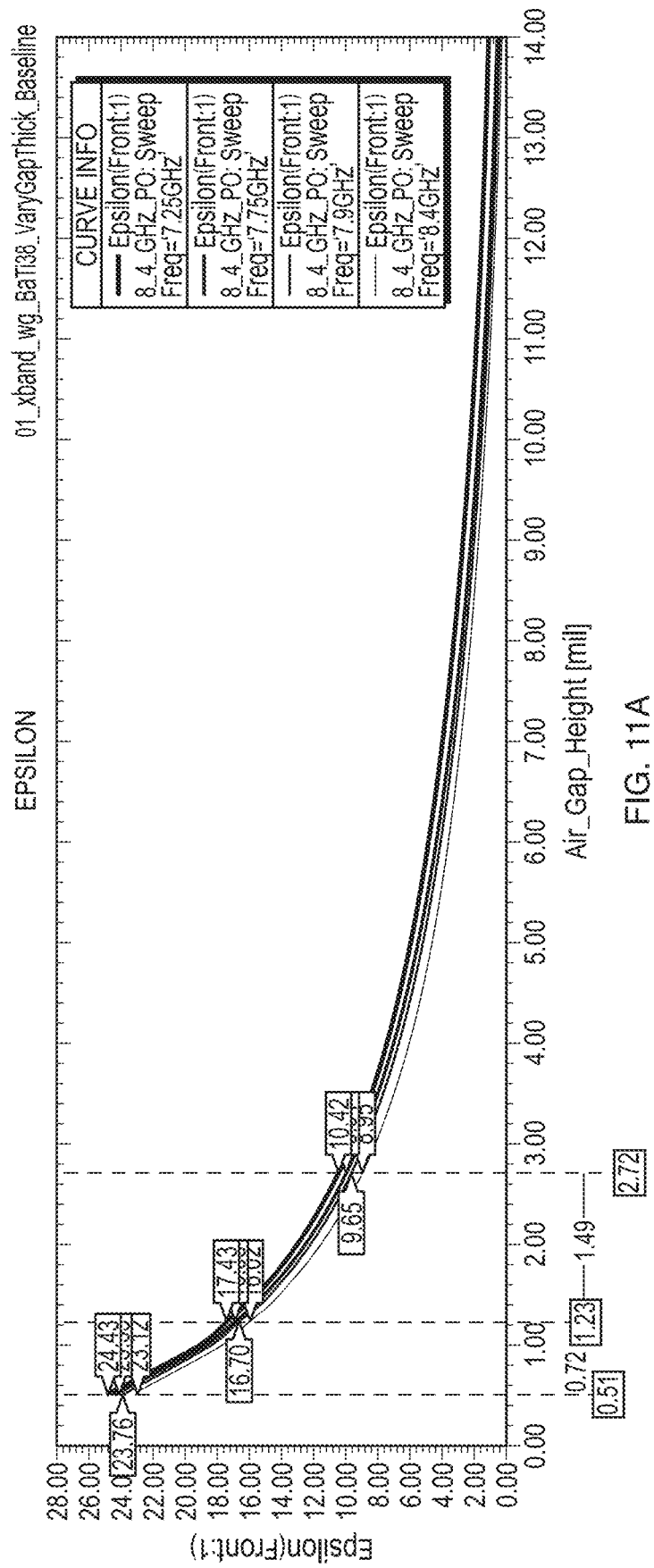
FIGS. 11A, 11B and 11C compare the air gap and varactor implementations.
Figure 11B:
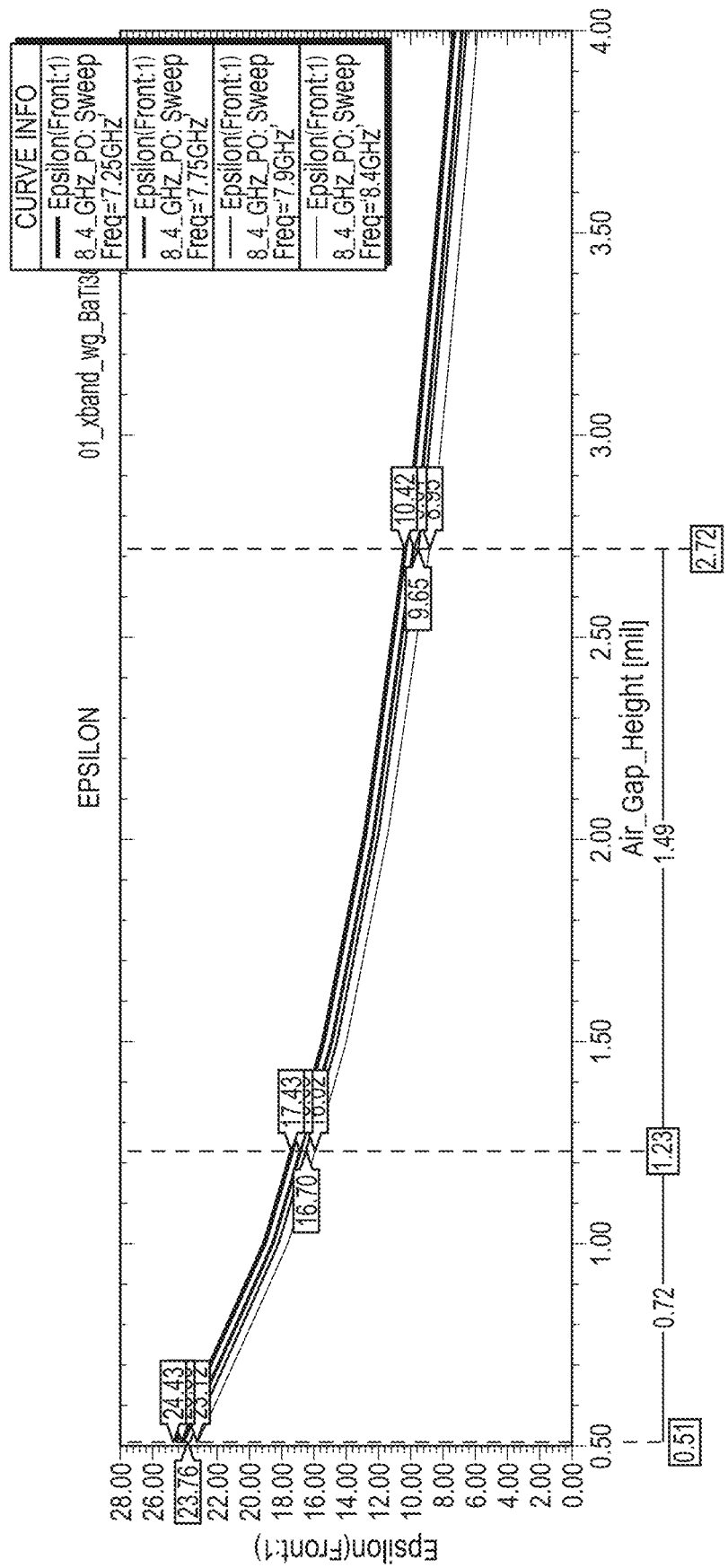
Figure 11C:
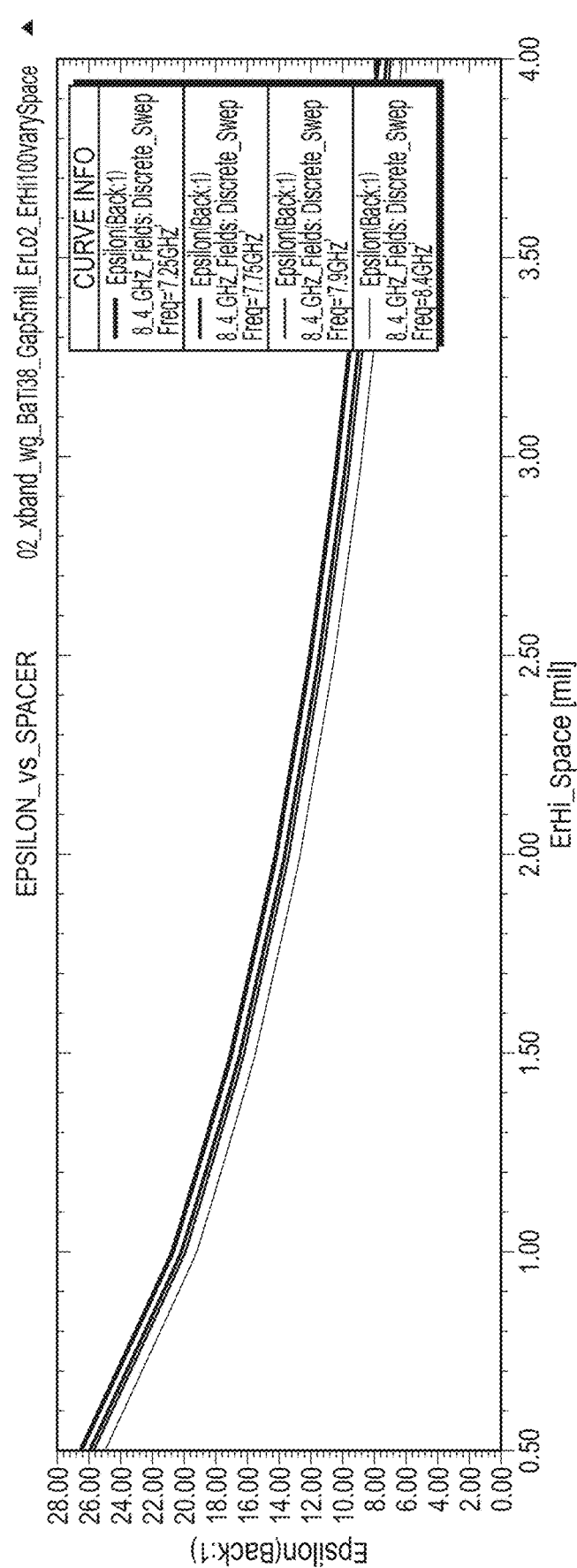

FIGS. 11A through 11C compare the operation of the air gap implementation of FIGS. 2A and 2B with varactor implementation of FIGS. 9A, 9B and 9C. FIG. 11A is the result of a computer simulation showing relative epsilon (propagation delay) versus air gap size. This particular simulation was for a radio frequency implementation operating at four frequencies (7.25 GHz, 7.75 GHz, 7.9 GHz and 8.4 GHz). FIG. 11B shows the result of using the "zoom" feature at the same frequencies, but where the range of scanning angles, or field of view, has been reduced. FIG. 11C is a similar plot for the varactor implementation, showing a similar relationship for propagation delay (for this implementation, versus varactor capacitance).

The invention claimed is:

1. An optical scanning apparatus comprising:
    a main waveguide structure formed as an elongated rectangle having a top surface and exit face;
    a main progressive delay layer disposed adjacent the top surface of the main waveguide;
    a second waveguide and second progressive delay layer disposed adjacent the exit face of the main waveguide, the second waveguide also having a top surface and an exit face;
    one or more detectors, disposed adjacent the exit face of the second waveguide; and
    wherein an index of refraction ($\varepsilon$) of the waveguides and/or progressive delay layers are adjustable, and
    wherein the progressive delay layers are provided by a series of varactors.

2. The apparatus of claim 1 wherein
    a dispersion of the main progressive delay layer matches a dispersion of the main waveguide; and
    a dispersion of the second progressive delay layer matches a dispersion of the second waveguide.

3. The apparatus of claim 1 wherein the top face of the second waveguide structure is disposed orthogonal to the exit face of the main waveguide structure.

4. The apparatus of claim 1 additionally comprising:
    a control, for progressively controlling the delay of the main and second delay layers, thereby in turn scan an angle of incidence of energy arriving on the top face of the main waveguide in two dimensions.

5. The apparatus of claim 1 wherein the progressive delay layers are each provided by a wedge layer and an adjustable gap structure.

6. An optical scanning apparatus comprising:
   a main waveguide structure formed as an elongated rectangle having a top surface and exit face;
   a main progressive delay layer disposed adjacent the top surface of the main waveguide;
   a second waveguide and second progressive delay layer disposed adjacent the exit face of the main waveguide, the second waveguide also having a top surface and an exit face;
   one or more detectors, disposed adjacent the exit face of the second waveguide; and
   wherein an index of refraction ($\varepsilon$) of the waveguides and/or progressive delay layers are adjustable, and additionally comprising:
   a light source, coupled to the exit face of the second waveguide; and
   a controller, for alternately operating the device in a camera mode and Lidar mode to produce three dimensional pixel data including image information and distance information.

7. The apparatus of claim 6 wherein
   a dispersion of the main progressive delay layer matched a dispersion of the main waveguide; and
   a dispersion of the second progresive delay layer matches a dispersion of the second waveguide.

8. The apparatus of claim 6 wherein the top face of the second waveguide structure is disposed orthogonal to the exit face of the main waveguide structure.

9. The apparatus of claim 6 additionally comprising:
   a control, for progressively controlling the delay of the main and second delay layers, thereby in turn scan an angle of incidence of energy arriving on the top face of the main waveguide in two dimensions.

10. The apparatus of claim 6 wherein the progressive delay layers are each provided by a wedge layer and an adjustable gap structure.

* * * * *